United States Patent
Davis et al.

(10) Patent No.: US 12,237,645 B2
(45) Date of Patent: Feb. 25, 2025

(54) RAPID RECHARGE LASER DRIVER CIRCUIT

(71) Applicant: LG INNOTEK CO., LTD., Seoul (KR)

(72) Inventors: Ryan T. Davis, Woodside, CA (US); Dane P. Bennington, Pittsburgh, PA (US)

(73) Assignee: LG INNOTEK CO., LTD., Seoul (KR)

( * ) Notice: Subject to any disclaimer, the term of this patent is extended or adjusted under 35 U.S.C. 154(b) by 964 days.

(21) Appl. No.: 17/077,026

(22) Filed: Oct. 22, 2020

(65) Prior Publication Data
US 2022/0131327 A1   Apr. 28, 2022

(51) Int. Cl.
*H01S 5/042* (2006.01)
*G01S 7/484* (2006.01)
(Continued)

(52) U.S. Cl.
CPC ............ *H01S 5/0428* (2013.01); *G01S 7/484* (2013.01); *G01S 17/931* (2020.01); *H02J 7/345* (2013.01); *H02J 2207/50* (2020.01)

(58) Field of Classification Search
CPC ...... H01S 5/0428; G01S 7/484; G01S 17/931; G01S 17/86; H02J 7/345; H02J 2207/50; H02J 7/0068
See application file for complete search history.

(56) References Cited

U.S. PATENT DOCUMENTS

| 5,138,622 A | 8/1992 | Friede et al. |
| 6,798,797 B2 | 9/2004 | Mangano et al. |

(Continued)

FOREIGN PATENT DOCUMENTS

| CN | 111337904 A | 6/2020 |
| EP | 4 080 696 A1 | 10/2022 |
| KR | 10-2019-0081318 A | 7/2019 |

OTHER PUBLICATIONS

International Search Report and Written Opinion of the International Searching Authority directed to related International Patent Application No. PCT/US2021/056070, mailed Feb. 4, 2022; 9 pages.

(Continued)

*Primary Examiner* — Jonathan M Hansen
(74) *Attorney, Agent, or Firm* — Birch, Stewart, Kolasch & Birch, LLP

(57) ABSTRACT

Devices, systems, and methods are provided for rapid laser recharging. A pulse emitting device may include an emitter to emit pulses, a first capacitor to provide pulses to the emitter, a second capacitor to charge the first capacitor, a first gate and a second gate to control the flow of current to the capacitors and the emitter, and a power supply configured to supply energy associated with the pulses. When the first gate is open, the first capacitor charges a first pulse of the pulses. When the first gate closes, the emitter emits the first pulse. When the first gate opens, the second gate closes and the second capacitor charges the first capacitor with a second pulse of the pulses. When the second gate opens after the second capacitor charges the first capacitor with the second pulse, the first gate closes and the emitter emits the second pulse.

15 Claims, 5 Drawing Sheets

(51) Int. Cl.
*G01S 17/931* (2020.01)
*H02J 7/34* (2006.01)

(56) References Cited

U.S. PATENT DOCUMENTS

| | | |
|---|---|---|
| 7,564,226 B2 | 7/2009 | von Kaenel |
| 8,184,670 B2 | 5/2012 | Crawford et al. |
| 10,277,007 B1 | 4/2019 | Lenius et al. |
| 10,785,841 B2 * | 9/2020 | Wojcik .................. H05B 45/46 |
| 2004/0160996 A1 | 8/2004 | Giorgi et al. |
| 2014/0063593 A1 * | 3/2014 | Berendt ............... H01S 5/0428 |
| | | 359/341.1 |
| 2018/0188360 A1 | 7/2018 | Berger et al. |
| 2018/0278011 A1 * | 9/2018 | Galvano ............... G01S 7/4813 |
| 2019/0229493 A1 * | 7/2019 | Stern ..................... H01S 5/0428 |
| 2019/0386460 A1 | 12/2019 | Barnes et al. |
| 2020/0119518 A1 | 4/2020 | Crawford et al. |
| 2020/0178361 A1 * | 6/2020 | Oka ........................ G01S 7/4815 |
| 2020/0203923 A1 * | 6/2020 | Yu .......................... G01S 17/89 |
| 2020/0205250 A1 * | 6/2020 | Lu .......................... G01S 7/484 |

OTHER PUBLICATIONS

Hu et al. "An Extremely Fast and High-Power Laser Diode Driver Module", Proceedings of SPIE—The International Society for Optical Engineering, Jan. 2, 2005, pp. 12-17, vol. 5628, Bellingham, Washington.

McQuage et al. "High Power Density Capacitor Charging Power Supply Development for Repetitive Pulsed Power", Directed Energy Technology Office, May 1, 2006, pp. 368-371, IEEE, New York, NY.

* cited by examiner

RAPID RECHARGE LASER DRIVER CIRCUIT

TECHNICAL FIELD

This disclosure generally relates to systems and methods for rapid laser recharging.

BACKGROUND

Some vehicles are equipped with a sensor system to collect data relating to the current and developing state of the vehicle's surroundings. The proper performance of a vehicle depends on the accuracy data collected by the sensors in the sensor system. The sensor system may comprise radars, visual spectrum cameras, laser-ranging devices (LIDARs), thermal sensors, or other types of sensors. The sensor system enables a vehicle to detect objects and obstacles in the vicinity of the vehicle and tracks the velocity and direction of pedestrians, other vehicles, traffic lights, or similar objects in the environment around the vehicle.

However, multi-pulse emissions for the sensor system may experience timing problems when limiting the energy used in a single pulse for safety reasons.

Figure 1:
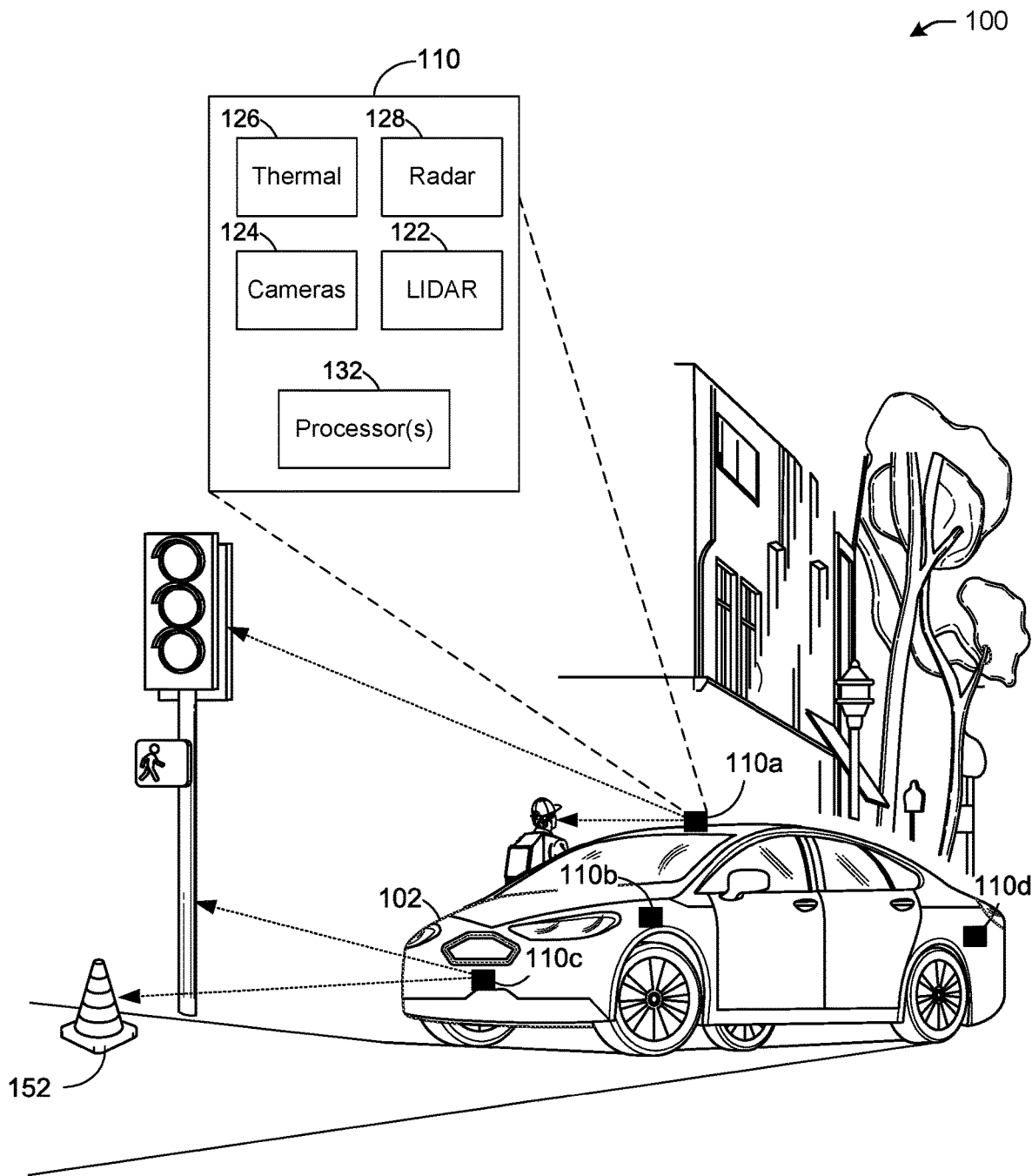
FIG. 1 illustrates example environment of a vehicle, in accordance with one or more example embodiments of the present disclosure.

Certain implementations will now be described more fully below with reference to the accompanying drawings, in which various implementations and/or aspects are shown. However, various aspects may be implemented in many different forms and should not be construed as limited to the implementations set forth herein; rather, these implementations are provided so that this disclosure will be thorough and complete, and will fully convey the scope of the disclosure to those skilled in the art. Like numbers in the figures refer to like elements throughout. Hence, if a feature is used across several drawings, the number used to identify the feature in the drawing where the feature first appeared will be used in later drawings.

DETAILED DESCRIPTION

Sensors may be located at various positions on an autonomous vehicle. These sensors may include light detection and ranging (LIDAR) sensors, stereo cameras, radar sensors, thermal sensors, or other sensors attached to an autonomous vehicle. These sensors may be originally used in a lab environment in order to perform high precision analyses of their performance under certain conditions. Autonomous vehicles may be driven in the real world and rely on the attached sensors to perform to a certain performance level under environmental factors. As the autonomous vehicles are driven in the real world, sensors such as radar rely on accurate detection of signals reflected from objects in the vicinity of the autonomous vehicle.

Multiple pulses (e.g., double and/or triple pulses) may be emitted for pulse encoding (e.g., range aliasing) of a LIDAR system, for rapid pulse emissions, and other applications. For example, multiple pulses of the same and/or varying durations, with delays in between the pulses, may allow for a LIDAR system to determine whether the return signal (e.g., caused by the reflection of the respective pulses off of an object) is from a current "shot" (e.g., pulse) rather than a return signal of a previous shot (e.g., a return from an object reflection based on a further away object). In this manner, pulse encoding may allow for LIDAR systems to identify, for any return signal, the corresponding pulse that resulted in the respective return signal.

To distinguish between shots, LIDAR systems may emit two rapid pulses at slightly varying timing. For example, an encoded set of pulses may include a 2-3 nanosecond pulse, followed by a 2-3 nanosecond delay, followed by a 2-3 nanosecond pulse (or other pulse lengths and/or delay lengths). For safety reasons (e.g., eye safety), the amount of energy discharged with a single pulse emission may be limited. Therefore, a capacitor used to store the energy for a pulse may be limited in size (e.g., capacitance) to allow for storage of enough energy for only one pulse at a time. In this manner, as the capacitor is discharged, the discharged energy may result in the emission of only a single pulse at a time.

In a single shot use, the capacitor limitation may not be an issue, but to emit multiple shots in rapid succession, such as with rapid multi-pulse encoding and/or rapid pulse charging used to control operation of a vehicle or other machine, a timing issue may arise. In particular, the capacitor that discharges the energy to an emitter for the emission of a pulse may need to recharge after discharging the energy for a single pulse. The recharging may require time that undermines a system's ability to rapidly emit multiple pulses in succession.

There is therefore a need for a rapid recharge laser driving circuit to rapidly recharge the capacitor(s) that supply energy to pulse emitters.

Example embodiments described herein provide certain systems, methods, and devices for a rapid recharge laser driving circuit.

In one or more embodiments, to provide rapid succession multi-pulse transmission (e.g., 30 amps at 12 volts), a recharge laser driving circuit may include multiple capacitors. One of the capacitors may hold energy sufficient for a single pulse at a time, and the discharging of the energy from the capacitor to an emitter may cause emission of the single pulse. One or more additional capacitors may facilitate rapid recharging of the capacitor that supplies an emitter. Once the capacitor that supplies the emitter discharges a single pulse, the one or more additional capacitors may supply the capacitor that supplies the emitter the energy for a single additional pulse at a time. In this manner, the one or more additional capacitors may be larger than the capacitor that supplies the emitter (e.g., the one or more additional capacitors may hold sufficient energy for multiple pulses at a time), and may charge without risk of overdriving the emitter.

In one or more embodiments, to facilitate the discharging and rapid recharging of the capacitor that supplies the emitter, gates (e.g., transistors, switches, etc.) may be used to control the flow of energy. For example, a first gate between the emitter and the capacitor that supplies the emitter may control the supply of energy from the capacitor that supplies the emitter to the emitter such that when the first gate is open, no energy flows from the capacitor that supplies the emitter to the emitter, and when the first gate closes, the energy stored in the capacitor that supplies the emitter flows to the emitter, providing a single pulse at a time. The energy for the pulses may be supplied by one or more power supplies. An additional capacitor may receive power from the one or more power supplies, and using a second gate in between the additional capacitor and the capacitor that supplies the emitter, rapidly may recharge the capacitor that supplies the emitter once a pulse is emitted. For example, the second gate may be open while the capacitor that supplies the emitter is fully charged and while the capacitor that supplies the emitter discharges a pulse to the emitter. Once the emitter emits a pulse, the first gate may open and the second gate may close, allowing the additional capacitor to rapidly recharge the capacitor that supplies the emitter with one of the multiple pulses of energy that may be stored by the additional capacitor at a given time. Once the capacitor that supplies the emitter has recharged, the second gate may close and the first gate may open again, resulting in another discharge of the capacitor that supplies the emitter and an emission of a pulse by the emitter. The recharge laser driving circuit may rapidly pulse wave modulate the second gate of the recharge laser driving circuit to control the power of any emitted pulse.

In one or more embodiments, the recharge laser driving circuit may include one or more additional power sources that may charge a third capacitor larger than the capacitor that supplies the emitter. A third gate may allow for the flow of energy from the third capacitor to the capacitor that supplies the emitter. A system may use amplitude modulation to facilitate emissions based on power supplied by multiple power sources in the recharge laser driving circuit.

In one or more embodiments, to avoid the risk of overdriving the emitter of the recharge laser driving circuit (e.g., because the first gate or the second gate fails), the recharge laser driving circuit may need to detect when the first gate or the second gate fails (e.g., by detecting a voltage drop across the first gate and/or second gate). To avoid overdriving the emitter, the first gate and the second gate may not be on/closed at the same time. The recharge laser driving circuit may include a first shunt resistor (or any current limiting component) between the power supply and the first gate, and a second shunt resistor between the second gate and the power supply. The power supply continuously may charge the additional capacitor through the second shunt resistor. The second shunt resistor may be larger than the first shunt resistor, and may be sized relative to the average expected current of a pulse. In this manner, the second shunt resistor may prevent continuous high current from flowing from a power supply to the emitter.

In one or more embodiments, the recharge laser driving circuit may apply to LIDAR pulse and other applications, for example imaging systems with rapid capture. The recharge laser driving circuit may provide a capacitive discharge solution for rapid emission/capture uses, allowing for eye safety power restrictions.

The above descriptions are for purposes of illustration and are not meant to be limiting. Numerous other examples, configurations, processes, etc., may exist, some of which are described in greater detail below. Example embodiments will now be described with reference to the accompanying figures.

FIG. 1 illustrates example environment 100 of a vehicle 102, in accordance with one or more example embodiments of the present disclosure.

Referring to FIG. 1, there is shown a vehicle 102 having a sensor system 110 for a plurality of cameras, emitters, and sensors. The sensor system 110 may be connected to the vehicle 102. In this environment 100, there is shown that sensor system 110 includes sensors such as sensors 110a, 110b, 110c, and 110d. It should be noted that other sensors not shown in this figure may also be attached to the vehicle 102 and that the sensors 110a, 110b, 110c, and 110d are used for illustrative purposes. These sensors may detect objects (e.g., object 152) in the vicinity and around the vehicle 102. Other emitters and sensors in the sensor system 110 may transmit and/or receive one or more signals in order to detect and/or capture information associated with objects in the vicinity and around the vehicle 102. For example, a LIDAR sensor may transmit a LIDAR signal (e.g., light or an electromagnetic wave), a radar uses radio waves in order to determine distances between the vehicle and objects in the vicinity of the vehicle, and a thermal sensor may capture temperature (e.g., based on an emitted and detected infrared signal or other laser signals).

In one or more embodiments, the sensor system 110 may include LIDAR 122. Some examples of a LIDAR may include Geiger mode LIDAR, linear mode LIDAR, large footprint LIDAR, small footprint LIDAR, or the like. The sensor system 110 may include cameras 124 such as stereo cameras that may capture images in the vicinity of the vehicle 102. The sensor system 110 may include a thermal sensor 126, such as thermistors, resistance temperature detectors, thermocouples, semiconductors, or the like. Further, the sensor system may include a radar 128, which may be any radar that uses radio waves to capture data from objects surrounding the vehicle 102. The sensor system 110 may also include one or more processors 132. The one or more processors 132 may control the transmission and reception of signals using the LIDAR 122, the cameras 124, the thermal sensor 126, and the radar 128. The various sensors of the sensor system 110, when calibrated correctly, should indicate a proper distance and shape of object 152.

In one or more embodiments, the sensor system 110 may emit multiple pulses (e.g., double and/or triple pulses) for pulse encoding (e.g., range aliasing) or rapid multi-pulse emissions (e.g., non-encoded multi-pulse emissions). For example, multiple pulses of the same and/or varying durations, with delays in between the pulses, may allow for the sensor system 110 to determine whether the return signal (e.g., caused by the reflection of the respective pulses off of an object) is from a current "shot" (e.g., pulse) rather than a return signal of a previous shot (e.g., a return from a further away object reflection). In this manner, pulse encoding may allow for the sensor system 110 to identify, for any return signal, the corresponding pulse that resulted in the respective return signal.

To distinguish between shots, the sensor system 110 may emit two rapid pulses at slightly varying timing. For safety reasons (e.g., eye safety), the amount of energy discharged with a single pulse emission may be limited. To emit multiple shots in rapid succession while maintaining eye safety, such as with multi-pulse encoding, the sensor system 110 may use a rapid recharge laser driving circuit as shown in FIG. 2 and FIG. 3.

It is understood that the above descriptions are for purposes of illustration and are not meant to be limiting.

Figure 2:
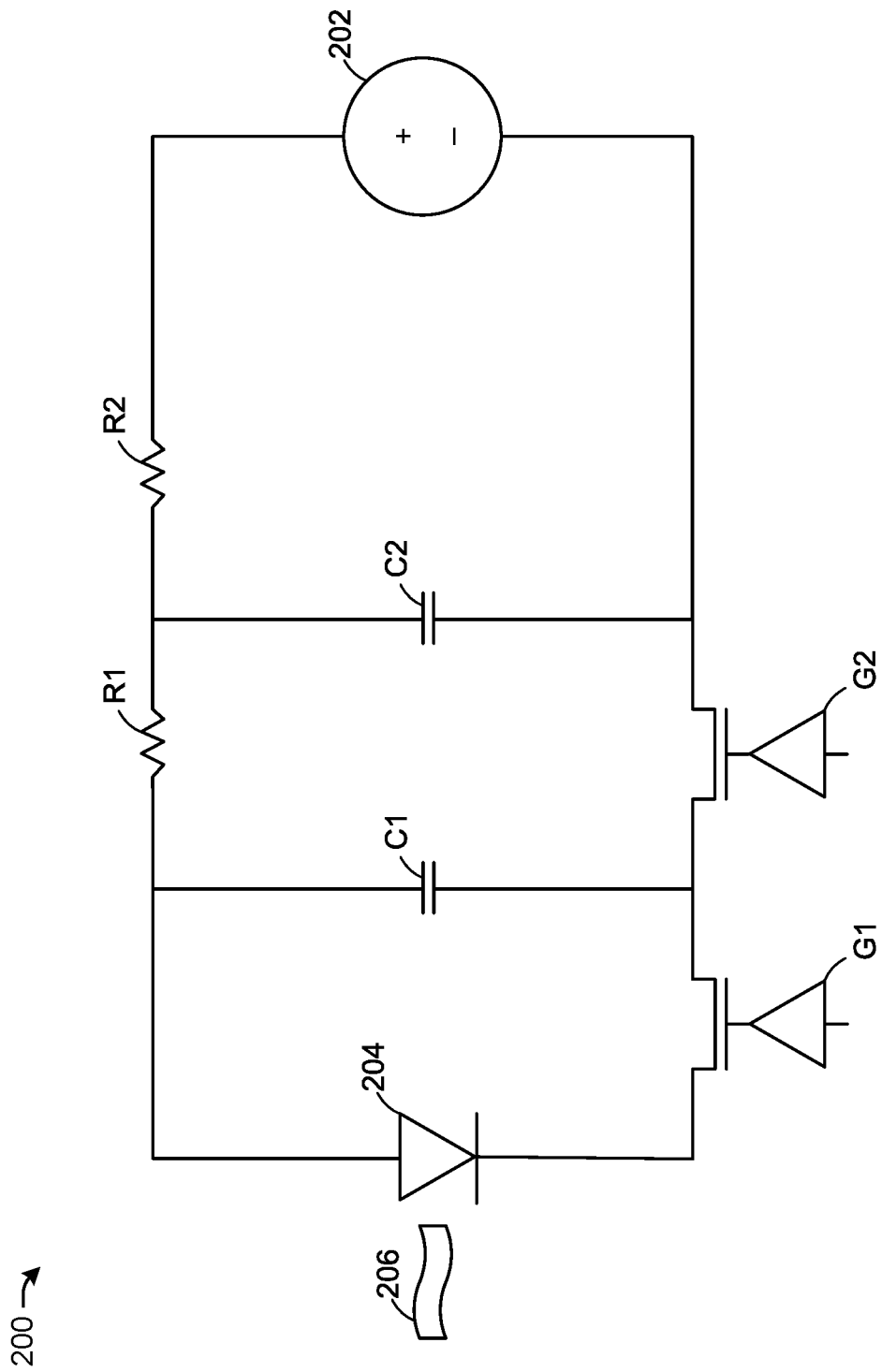
FIG. 2 depicts an illustrative schematic diagram for a rapid recharge laser driver circuit, in accordance with one or more example embodiments of the present disclosure.
Figure 3:
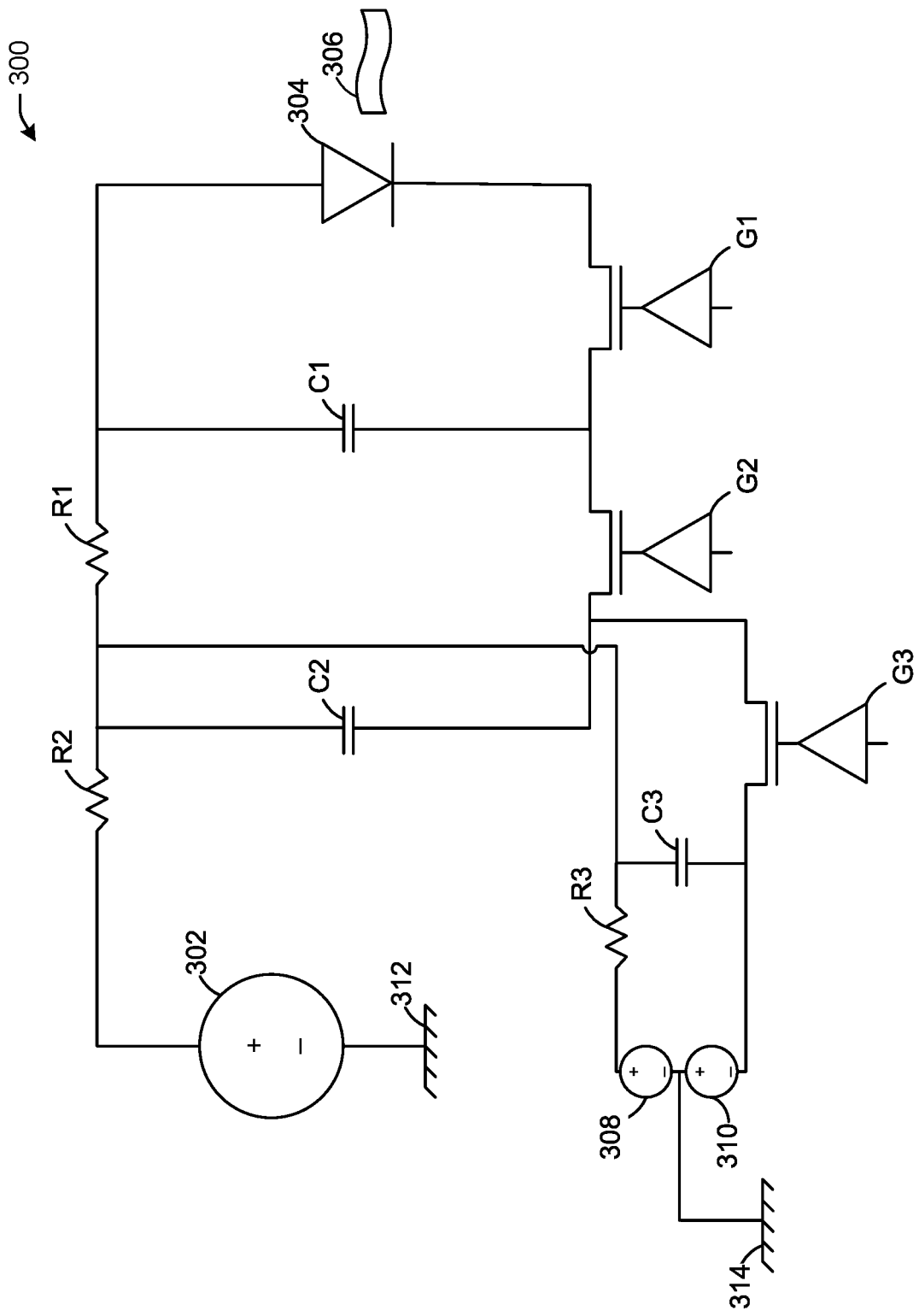
FIG. 3 depicts an illustrative schematic diagram for a rapid recharge laser driver circuit, in accordance with one or more example embodiments of the present disclosure.

FIG. 2 depicts an illustrative schematic diagram for a rapid recharge laser driver circuit 200, in accordance with one or more example embodiments of the present disclosure.

Referring to FIG. 2, the rapid recharge laser driver circuit 200 may be included in the sensor system 110 of FIG. 1. The rapid recharge laser driver circuit 200 may include a power source 202 (e.g., a power supply), an emitter 204 (e.g., a laser for LIDAR pulses, such as for the LIDAR 122 of FIG. 1), a first capacitor C1, a second capacitor C2, a first gate G1, a second gate G2, a first resistor R1, and a second resistor R2. The emitter 204 may emit pulses 206 or other signals.

In one or more embodiments, the first capacitor C1 may hold energy sufficient for a single pulse at a time, and the discharging of the energy from the first capacitor C1 to the emitter 204 may cause emission of the single pulse. The second capacitor C2 may facilitate rapid recharging of the first capacitor C1. Once the first capacitor C1 discharges a single pulse, the second capacitor C2 may supply the first capacitor C1 the energy (e.g., from the power source 202) for a single additional pulse at a time. In this manner, the second capacitor C2 may be larger than the first capacitor C1, and may charge the first capacitor C1 without risk of overdriving the emitter 204.

In one or more embodiments, to facilitate the discharging and rapid recharging of the first capacitor C1, the first and second gates (e.g., transistors, switches, etc.) may be used to control the flow of energy. For example, the first gate G1 between the emitter 204 and the first capacitor C1 may control the supply of energy from the first capacitor C1 to the emitter 204 such that when the first gate G1 is open, no energy flows from the first capacitor C1 to the emitter 204, and when the first gate G1 closes, the energy stored in the first capacitor C1 flows to the emitter 204, providing a single pulse at a time. The second capacitor C2 may receive power from the power source 202, and using the second gate G2 in between the second capacitor C2 and the first capacitor C1, rapidly may recharge the first capacitor C1 once a pulse is emitted. For example, the second gate G2 may be open while the first capacitor C1 is fully charged and while the first capacitor C1 discharges a pulse to the emitter 204. Once the emitter 204 emits a pulse, the first gate G1 may open and the second gate G2 may close, allowing the second capacitor C2 to rapidly recharge the first capacitor C1 with one of the multiple pulses of energy that may be stored by the second capacitor C2 at a given time. Once the first capacitor C1 has recharged, the second gate G2 may close and the first gate G1 may open again, resulting in another discharge of the first capacitor C1 and an emission of a pulse by the emitter 204. The recharge laser driving circuit 200 may rapidly pulse wave modulate the second gate G2 to control the power of any emitted pulse.

In one or more embodiments, to avoid the risk of overdriving the emitter of the recharge laser driving circuit 200, the first gate G1 and the second gate G2 may not be on/closed at the same time. The first resistor R1 (or any current limiting component) may be between the power source 202 and the first gate G1, and a second resistor R2 between the second gate G2 and the power source 202. The power source 202 continuously may charge the second capacitor C2 through the second resistor R2. The second resistor R2 may be larger than the first resistor R1, and may be sized relative to the average expected current of a pulse. In this manner, the second resistor R2 may prevent continuous high current from flowing from the power source 202 to the emitter 204.

It is understood that the above descriptions are for purposes of illustration and are not meant to be limiting.

FIG. 3 depicts an illustrative schematic diagram for a rapid recharge laser driver circuit 300, in accordance with one or more example embodiments of the present disclosure.

Referring to FIG. 3, the rapid recharge laser driver circuit 300 may be included in the sensor system 110 of FIG. 1. The rapid recharge laser driver circuit 300 may include a power source 302 (e.g., a power supply), an emitter 304 (e.g., a laser for LIDAR pulses, such as for the LIDAR 122 of FIG. 1), a first capacitor C1, a second capacitor C2, a first gate G1, a second gate G2, a first resistor R1, and a second resistor R2. The emitter 304 may emit pulses 306 or other signals. In this manner, the rapid recharge laser driver circuit 300 may function similar to the rapid recharge laser driver circuit 200 of FIG. 2.

Still referring to FIG. 3, the rapid recharge laser driver circuit 300 may differ from the rapid recharge laser driver circuit 200 of FIG. 2 in that the rapid recharge laser driver circuit 300 may include additional power sources (e.g., power source 308, power source 310). The energy supplied by the power source 308 and/or the power source 310 may be used to recharge the capacitor C1 after the capacitor C1 has discharged and provided a pulse to the emitter 304 (e.g., as described above with regard to FIG. 2). In addition to the second capacitor C2, the rapid recharge laser driver circuit 300 may include a third capacitor C3 that continuously may be charged by the power source 308 and/or the power source 310. A third gate G3 may close to provide a charge from the third capacitor C3 to the first capacitor C1 to recharge the capacitor C1. In this manner, C3 should not be closed/on at the same time when C1 is closed/on. The rapid recharge laser driver circuit 300 may implement amplitude modulation to allow for pulses using the alternative/additional power sources (e.g., power source 308, power source 310). The power source 302 may be grounded by ground 312, and the power source 308 and/or the power source 310 may be grounded by ground 314.

It is understood that the above descriptions are for purposes of illustration and are not meant to be limiting.

Figure 4:
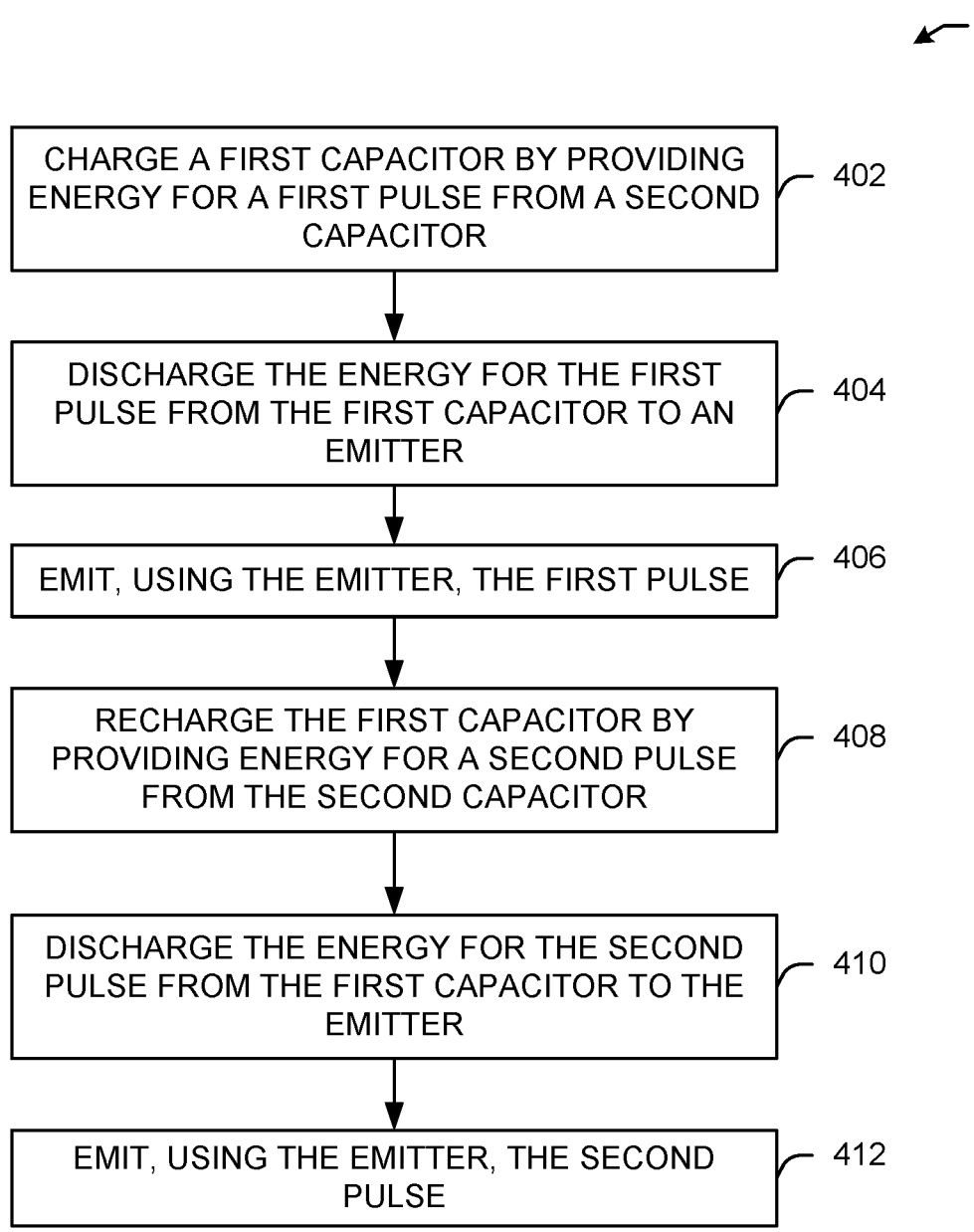
FIG. 4 illustrates a flow diagram of a process for a rapid recharge laser driver circuit, in accordance with one or more example embodiments of the present disclosure.

FIG. 4 illustrates a flow diagram of a process 400 for a rapid recharge laser driver circuit, in accordance with one or more example embodiments of the present disclosure.

At block 402, a device (e.g., or system, such as the sensor system 110 of FIG. 1, the rapid recharge laser driver circuit 200 of FIG. 2, the rapid recharge laser driver circuit 300 of FIG. 3) may charge a first capacitor of the device (e.g., capacitor C1 of FIG. 2 and FIG. 3) by providing energy for a pulse to the first capacitor. The device may include a power source (e.g., the power source 202 of FIG. 2, the power sources 302, 308, and 312 of FIG. 3) that continuously may charge a second capacitor (e.g., the second capacitor C2 of FIG. 2 and FIG. 3) of the device, and the second capacitor may recharge the first capacitor. The first capacitor may be sized to hold only enough charge for a single pulse to be emitted by an emitter of the device (e.g., the emitter 204 of FIG. 2, the emitter 304 of FIG. 3).

At block 404, the device may discharge the first capacitor. The device may open the second gate to stop the flow to the first capacitor, and may close the first gate to allow for the first pulse at the first capacitor to flow to the emitter. In this manner, when the first gate is closed, the second gate is opened to avoid a flow from the second capacitor to the emitter, overdriving the emitter.

At block 406, the emitter may emit a first pulse. When a first gate (e.g., the first gate G1 of FIG. 2 and FIG. 3) is closed, the first capacitor may discharge by providing its stored pulse energy to the emitter for transmission of the first pulse. After the first pulse has been emitted, the first capacitor may recharge.

At block 408, the device may recharge the first capacitor by closing a second gate of the device (e.g., the second gate G2 of FIG. 2 and FIG. 3). To avoid overdriving the emitter, when the second gate closes, the first gate may open, preventing any charge stored by the first capacitor from flowing to the emitter. When the first gate is open, the second gate, between the first capacitor and the second capacitor, may close, allowing a charge from the second capacitor to flow to the first capacitor, thereby recharging the first capacitor with enough energy to emit a single pulse with the emitter. However, the first gate may remain closed during the recharging of the first capacitor.

At block 410, the device may discharge the first capacitor. The device may open the second gate to stop the flow to the first capacitor, and may close the first gate to allow for the second pulse at the first capacitor to flow to the emitter. In this manner, when the first gate is closed, the second gate is opened to avoid a flow from the second capacitor to the emitter, overdriving the emitter.

At block 412, the device may emit the second pulse. Because the first capacitor only stores enough energy for a single pulse emission, the discharge of the energy at block 410 may result in only one pulse for the emitter to emit.

The pulses may be LIDAR pulses or other signals. The pulses may be encoded and emitted in a sequence (e.g., any pulse may be emitted for duration, such as a few nanoseconds, with delays of a few nanoseconds or milliseconds in between pulses) to allow for pulse encoding or non-encoded multi-pulse emissions.

It is understood that the above descriptions are for purposes of illustration and are not meant to be limiting.

Figure 5:
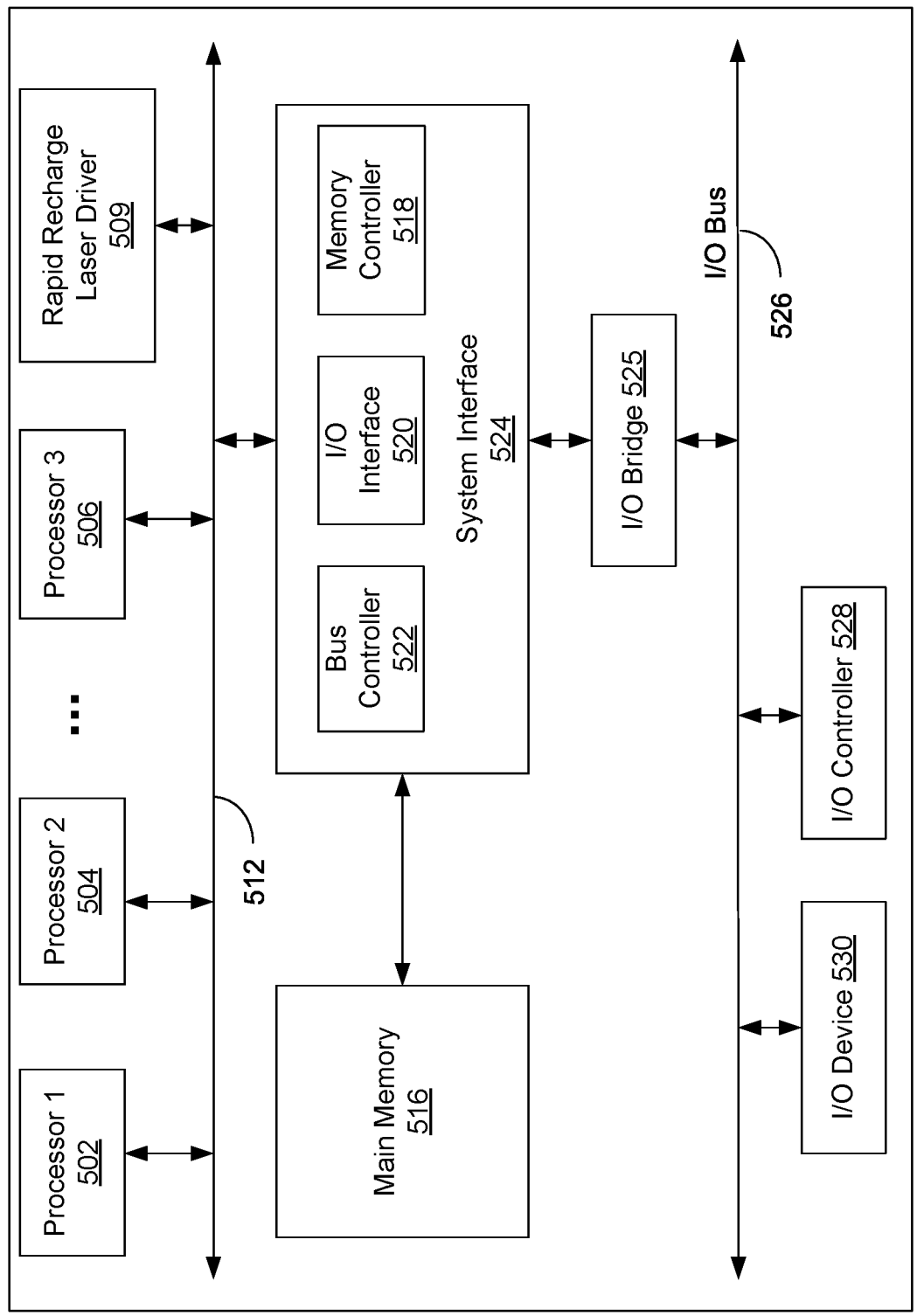
FIG. 5 is a block diagram illustrating an example of a computing device or computer system upon which any of one or more techniques (e.g., methods) may be performed, in accordance with one or more example embodiments of the present disclosure.

FIG. 5 is a block diagram illustrating an example of a computing device or computer system 500 upon which any of one or more techniques (e.g., methods) may be performed, in accordance with one or more example embodiments of the present disclosure.

For example, the computing system 500 of FIG. 5 may represent one or more processors 132 of FIG. 1, and therefore may facilitate the emission, reception, and processing of pulses and/or other signals. The computer system (system) includes one or more processors 502-506. Processors 502-506 may include one or more internal levels of cache (not shown) and a bus controller (e.g., bus controller 522) or bus interface (e.g., I/O interface 520) unit to direct interaction with the processor bus 512. A rapid recharge laser driver 509 (e.g., the rapid recharge laser driver circuit 200 of FIG. 2, the rapid recharge laser driver circuit 300 of FIG. 3) may also be in communication with the Processors 502-506 and may be connected to the processor bus 512.

Processor bus 512, also known as the host bus or the front side bus, may be used to couple the processors 502-506 and/or the rapid recharge laser driver 509 with the system interface 524. System interface 524 may be connected to the processor bus 512 to interface other components of the system 500 with the processor bus 512. For example, system interface 524 may include a memory controller 518 for interfacing a main memory 516 with the processor bus 512. The main memory 516 typically includes one or more memory cards and a control circuit (not shown). System interface 524 may also include an input/output (I/O) interface 520 to interface one or more I/O bridges 525 or I/O devices 530 with the processor bus 512. One or more I/O controllers and/or I/O devices may be connected with the I/O bus 526, such as I/O controller 528 and I/O device 530, as illustrated.

I/O device 530 may also include an input device (not shown), such as an alphanumeric input device, including alphanumeric and other keys for communicating information and/or command selections to the processors 502-506 and/or the rapid recharge laser driver 509. Another type of user input device includes cursor control, such as a mouse, a trackball, or cursor direction keys for communicating direction information and command selections to the processors 502-506 and/or the rapid recharge laser driver 509 and for controlling cursor movement on the display device.

System 500 may include a dynamic storage device, referred to as main memory 516, or a random access memory (RAM) or other computer-readable devices coupled to the processor bus 512 for storing information and instructions to be executed by the processors 502-506 and/or the rapid recharge laser driver 509. Main memory 516 also may be used for storing temporary variables or other intermediate information during execution of instructions by the processors 502-506 and/or the rapid recharge laser driver 509. System 500 may include read-only memory (ROM) and/or other static storage device coupled to the processor bus 512 for storing static information and instructions for the processors 502-506 and/or the rapid recharge laser driver 509. The system outlined in FIG. 5 is but one possible example of a computer system that may employ or be configured in accordance with aspects of the present disclosure.

According to one embodiment, the above techniques may be performed by computer system 500 in response to processor 504 executing one or more sequences of one or more instructions contained in main memory 516. These instructions may be read into main memory 516 from another machine-readable medium, such as a storage device. Execution of the sequences of instructions contained in main memory 516 may cause processors 502-506 and/or the rapid recharge laser driver 509 to perform the process steps described herein. In alternative embodiments, circuitry may be used in place of or in combination with the software instructions. Thus, embodiments of the present disclosure may include both hardware and software components.

Various embodiments may be implemented fully or partially in software and/or firmware. This software and/or firmware may take the form of instructions contained in or on a non-transitory computer-readable storage medium. Those instructions may then be read and executed by one or more processors to enable the performance of the operations described herein. The instructions may be in any suitable form, such as, but not limited to, source code, compiled code, interpreted code, executable code, static code, dynamic code, and the like. Such a computer-readable medium may include any tangible non-transitory medium for storing information in a form readable by one or more computers, such as but not limited to read-only memory (ROM); random access memory (RAM); magnetic disk storage media; optical storage media; a flash memory, etc.

A machine-readable medium includes any mechanism for storing or transmitting information in a form (e.g., software, processing application) readable by a machine (e.g., a computer). Such media may take the form of, but is not limited to, non-volatile media and volatile media and may include removable data storage media, non-removable data storage media, and/or external storage devices made available via a wired or wireless network architecture with such computer program products, including one or more database management products, web server products, application server products, and/or other additional software components. Examples of removable data storage media include Compact Disc Read-Only Memory (CD-ROM), Digital Versatile Disc Read-Only Memory (DVD-ROM), magneto-optical disks, flash drives, and the like. Examples of non-removable data storage media include internal magnetic hard disks, solid state devices (SSDs), and the like. The one or more memory devices 506 (not shown) may include volatile memory (e.g., dynamic random access memory (DRAM), static random access memory (SRAM), etc.) and/or non-volatile memory (e.g., read-only memory (ROM), flash memory, etc.).

Computer program products containing mechanisms to effectuate the systems and methods in accordance with the presently described technology may reside in main memory 516, which may be referred to as machine-readable media. It will be appreciated that machine-readable media may include any tangible non-transitory medium that is capable of storing or encoding instructions to perform any one or more of the operations of the present disclosure for execution by a machine or that is capable of storing or encoding data structures and/or modules utilized by or associated with such instructions. Machine-readable media may include a single medium or multiple media (e.g., a centralized or distributed database, and/or associated caches and servers) that store the one or more executable instructions or data structures.

Embodiments of the present disclosure include various steps, which are described in this specification. The steps may be performed by hardware components or may be embodied in machine-executable instructions, which may be used to cause a general-purpose or special-purpose processor programmed with the instructions to perform the steps. Alternatively, the steps may be performed by a combination of hardware, software, and/or firmware.

Various modifications and additions can be made to the exemplary embodiments discussed without departing from the scope of the present invention. For example, while the embodiments described above refer to particular features, the scope of this invention also includes embodiments having different combinations of features and embodiments that do not include all of the described features. Accordingly, the scope of the present invention is intended to embrace all such alternatives, modifications, and variations together with all equivalents thereof.

The operations and processes described and shown above may be carried out or performed in any suitable order as desired in various implementations. Additionally, in certain implementations, at least a portion of the operations may be carried out in parallel. Furthermore, in certain implementations, less than or more than the operations described may be performed.

The word "exemplary" is used herein to mean "serving as an example, instance, or illustration." Any embodiment described herein as "exemplary" is not necessarily to be construed as preferred or advantageous over other embodiments.

As used herein, unless otherwise specified, the use of the ordinal adjectives "first," "second," "third," etc., to describe a common object, merely indicates that different instances of like objects are being referred to and are not intended to imply that the objects so described must be in a given sequence, either temporally, spatially, in ranking, or any other manner.

It is understood that the above descriptions are for purposes of illustration and are not meant to be limiting.

Although specific embodiments of the disclosure have been described, one of ordinary skill in the art will recognize that numerous other modifications and alternative embodiments are within the scope of the disclosure. For example, any of the functionality and/or processing capabilities described with respect to a particular device or component may be performed by any other device or component. Further, while various illustrative implementations and architectures have been described in accordance with embodiments of the disclosure, one of ordinary skill in the art will appreciate that numerous other modifications to the illustrative implementations and architectures described herein are also within the scope of this disclosure.

Although embodiments have been described in language specific to structural features and/or methodological acts, it is to be understood that the disclosure is not necessarily limited to the specific features or acts described. Rather, the specific features and acts are disclosed as illustrative forms of implementing the embodiments. Conditional language, such as, among others, "can," "could," "might," or "may," unless specifically stated otherwise, or otherwise understood within the context as used, is generally intended to convey that certain embodiments could include, while other embodiments do not include, certain features, elements, and/or steps. Thus, such conditional language is not generally intended to imply that features, elements, and/or steps are in any way required for one or more embodiments or that one or more embodiments necessarily include logic for deciding, with or without user input or prompting, whether these features, elements, and/or steps are included or are to be performed in any particular embodiment.

The invention claimed is:

1. A light detection and ranging (LIDAR) pulse emitting device, comprising:
    an emitter configured to emit pulses;
    a first capacitor configured to provide energy to the emitter to create the pulses;
    a second capacitor configured to charge the first capacitor;
    a first gate configured to control in part a first discharge of the energy from the first capacitor through the emitter;
    a second gate configured to control in part a second discharge of the energy from the second capacitor; and
    a power supply configured to supply the energy associated with the pulses, wherein:
        when the first gate is open, the first capacitor charges a first pulse of the pulses,
        when the first gate closes, the emitter emits the first pulse,
        when the first gate opens after the emitter emits the first pulse, the second gate closes and the second capacitor charges the first capacitor with a second pulse of the pulses, and
        when the second gate opens after the second capacitor charges the first capacitor with the second pulse, the first gate closes and the emitter emits the second pulse,
    wherein the first capacitor is connected in parallel to the second capacitor, and
    wherein the pulse emitting device further comprises:
        an additional power source configured to recharge the first capacitor;
        a third capacitor connected in parallel to the additional power source and continuously charged by the additional power source; and
        a third gate having one end connected to one end of the additional power source and one end of the third capacitor, and the other end connected to one end of the second capacitor and one end of the second gate, wherein the third gate is controlled to close to provide a charge from the third capacitor to the first capacitor to recharge the first capacitor, and wherein the third gate is controlled to not be operated in the same state as the first gate.

2. The pulse emitting device of claim 1, wherein the first pulse and the second pulse are light detection and ranging (LIDAR) pulses.

3. The pulse emitting device of claim 1, wherein the emitter is configured to emit the first pulse at a first time, and to emit the second pulse at a second time within three nanoseconds of the first time.

4. The pulse emitting device of claim 1, wherein the first capacitor is configured to store, at a time, an amount of the energy for a single pulse of the pulses.

5. The pulse emitting device of claim 1, wherein the second capacitor is configured to receive the energy from the power supply while the first gate is open and while the second gate is closed, and wherein the second pulse is based on the energy.

6. The pulse emitting device of claim 1, wherein the second capacitor has a greater capacitance than the first capacitor.

7. The pulse emitting device of claim 1, further comprising a first resistor and a second resistor,
wherein the first resistor is connected between the first capacitor and the second capacitor, and
wherein the second resistor is connected between the second capacitor and the power supply.

8. The pulse emitting device of claim 1, wherein the first capacitor is connected in parallel to the emitter,
wherein the first gate is connected between the first capacitor and the emitter, and
wherein the second gate is connected between the first capacitor and the second capacitor.

9. The pulse emitting device of claim 1,
wherein the additional power source comprises:
a second power source configured to provide energy associated with a third pulse; and
a third power source configured to provide energy associated with a fourth pulse, wherein the emitter is further configured to emit the third pulse and the fourth pulse.

10. A light detection and ranging (LIDAR) pulse emitting system associated with a vehicle, the pulse emitting system comprising:
an emitter configured to emit pulses;
a first capacitor configured to provide energy to the emitter to create the pulses;
a second capacitor configured to charge the first capacitor, the second capacitor connected in parallel to the first capacitor;
a first gate configured to control in part a first discharge of the energy from the first capacitor through the emitter;
a second gate configured to control in part a second discharge of the energy from the second capacitor; and
a power supply configured to supply the energy associated with the pulses, wherein:
when the first gate is open, the first capacitor charges a first pulse of the pulses,
when the first gate closes, the emitter emits the first pulse,
when the first gate opens after the emitter emits the first pulse, the second gate closes and the second capacitor charges the first capacitor with a second pulse of the pulses, and
when the second gate opens after the second capacitor charges the first capacitor with the second pulse, the first gate closes and the emitter emits the second pulse, and
wherein the pulse emitting device further comprises:
an additional power source configured to recharge the first capacitor;
a third capacitor connected in parallel to the additional power source and continuously charged by the additional power source; and
a third gate having one end connected to one end of the additional power source and one end of the third capacitor, and the other end connected to one end of the second capacitor and one end of the second gate,
wherein the third gate is controlled to close to provide a charge from the third capacitor to the first capacitor to recharge the first capacitor, and
wherein the third gate is controlled to not be operated in a same state as the first gate.

11. The pulse emitting system of claim 10, wherein the first pulse and the second pulse are light detection and ranging (LIDAR) pulses.

12. The pulse emitting system of claim 10, wherein the emitter is configured to emit the first pulse at a first time, and to emit the second pulse at a second time within three nanoseconds of the first time.

13. The pulse emitting system of claim 10, wherein the first capacitor is configured to store, at a time, an amount of the energy for a single pulse of the pulses.

14. The pulse emitting system of claim 10, wherein the second capacitor is configured to receive the energy from the power supply while the first gate is open and while the second gate is closed, and wherein the second pulse is based on the energy.

15. The pulse emitting system of claim 10, wherein the first capacitor is connected in parallel to the emitter, and
wherein the first gate is connected between the first capacitor and the emitter, and wherein the second gate is connected between the first capacitor and the second capacitor.

* * * * *